United States Patent [19]

Ohtani

[11] Patent Number: 5,322,818

[45] Date of Patent: Jun. 21, 1994

[54] METHOD FOR FORMING AN OXIDE SUPERCONDUCTING MATERIAL

[75] Inventor: Hisashi Ohtani, Kanagawa, Japan

[73] Assignee: Semiconductor Energy Laboratory Co., Ltd., Kanagawa, Japan

[21] Appl. No.: 27,794

[22] Filed: Mar. 8, 1993

Related U.S. Application Data

[63] Continuation-in-part of Ser. No. 735,348, Jul. 24, 1991, Pat. No. 5,225,396.

[30] Foreign Application Priority Data

Jul. 25, 1990 [JP] Japan .................................. 2-196868
Mar. 11, 1992 [JP] Japan .................................. 4-087660

[51] Int. Cl.$^5$ ......................... B05D 5/12; H01L 39/00
[52] U.S. Cl. ................................. 505/473; 505/730; 505/734; 427/62; 427/255.3; 427/255.2; 427/126.3; 257/422
[58] Field of Search ............... 505/1, 730, 734, 742; 427/62, 63, 255.3, 255.2, 126.3; 257/422

[56] References Cited

U.S. PATENT DOCUMENTS 5,225,396 7/1993 Ohtani .................................. 505/1

*Primary Examiner*—Roy V. King
*Attorney, Agent, or Firm*—Sixbey, Friedman, Leedom & Ferguson

[57] ABSTRACT

A method for forming an oxide superconducting material by preparing first a shaped magnetic shield comprising an oxide superconductor as a matrix, and then effecting CVD and further EVD to fill in the pores of the matrix with an oxide superconductor; more specifically, it comprises introducing an oxidizing gas to said shaped magnetic shield from either inside or outside the shaped magnetic shield while introducing a material gas of said oxide superconductor from the other side thereof, and then maintaining said shaped magnetic shield at this state under a high temperature.

17 Claims, 3 Drawing Sheets

METHOD FOR FORMING AN OXIDE SUPERCONDUCTING MATERIAL

This application is a continuation in part of copending application Ser. No. 735,348 filed Jul. 24, 1991, now U.S. Pat. No. 5,225,396 entitled Method For Forming an Oxide Superconducting Film.

BACKGROUND OF THE INVENTION

1. Field of Application

The present invention relates to a method for forming a shaped article from a defect-free oxide superconducting material, more particularly, it relates to a process for producing a magnetic shielding container which utilizes Meissner effect.

2. Prior Art

Conventional processes for producing bulk materials from an oxide superconductor comprise, in general, packing a powder material and then sintering the resulting powder compact. It is also well known to conduct the sintering step by HIPping (Hot Isostatic Pressing) and the like to obtain a further densified material, or by melting a part of the composition (sometimes referred to as a "partial melting process") to increase the density of the bulk material.

As an improved process for powder sintering, there is known a process in which a paste, etc., obtained by dissolving the powder of an oxide superconductor to a pertinent dispersion medium, is utilized. The paste or slurry thus obtained may be directly shaped into a sheet by a doctor blade process and the like and sintered; otherwise, it may be applied to a base of a desired shape and sintered to obtain freely an oxide superconductor material of a desired shape.

Furthermore, study on a process involving chemical vapor deposition (CVD) and the like for coating a pertinent substrate or base with a thin film or a thick film of oxide superconductors is also in progress, particularly, for use in wire materials.

Although extensive studies are in progress, conventional processes for producing oxide superconducting materials are still far from being practical. The powder sintering process, for instance, allows almost no selection of shape and size; moreover, it accompanies technological difficulties in producing large scale sinterings, even if a material other than a superconducting material were to be sintered. Accordingly, it is next to impossible to sinter a large-scale superconducting material using this process. A HIPping process is advantageous in that it provides dense sinterings having high density, however, this process again, cannot be applied to the production of a large scale bulk material.

The process using a paste material and the like is superior in producing superconducting materials at a desired shape, and is now being applied to practical processes for manufacturing superconducting magnetic shields which are to be trial marketed. The superconducting materials produced by this process, however, result inevitably in porous sinterings because the organic matter and the like having incorporated in the dispersion medium escape during the sintering process. Thus, such superconducting materials often suffer insufficient quality for use as a magnetic shield.

The coating process using CVD and the like provides superconducting materials of best quality. However, the film which is obtained by the process is too thin to be used as a magnetic shield, because a certain volume as a bulk, i.e., a container having a wall with certain thickness, is necessary to yield a sufficient magnetic shielding effect. Thus, concerning the film deposition rate and other factors, the CVD process and the like at present cannot be applied to such products as magnetic shields.

SUMMARY OF THE INVENTION

The present invention provides a process which comprises a combination of a process using a paste and a coating process such as CVD. The process provides high quality oxide superconducting materials at a desired shape and yet with high productivity.

DETAILED DESCRIPTION OF THE INVENTION

Figure 1A:
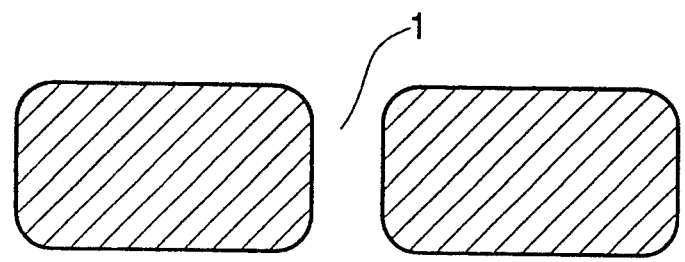
FIGS. 1(A), 1(B) and 1(C) show schematically a step for sealing the voids according to a gas supply process of the present invention.

The present invention is characterized by that it provides a shaped material, particularly, a magnetic shielding container, by a process for forming an oxide superconducting material comprising two major steps.

The first step of the process according to the present invention comprises producing a molding which serves as a matrix having the outline of the final shaped material, and this step is essentially the same as that of a conventional process using a paste and the like. More specifically, the step comprises preparing a slurry by mixing an oxide superconductor with an organic binder and the like; shaping the slurry into desired shape by, for example, shaping a sheet and coiling the resulting sheet, shaping the slurry into tiles and then adhering the resulting tiles using a paste and the like, and coating a base such as a YSZ (yttria stabilized zirconia) sintering with the slurry; and sintering the resulting shaped slurry. However, the advantage of the conventional process using a paste and the like, which was simplicity, was sometimes lost where the process was intended for producing a dense shaped product by the process alone. More specifically, the process was no longer advantageous in such cases where a strict temperature control was required. In the present invention, however, the process is used only for forming the matrix which may be somewhat porous. Accordingly, the first step in the present invention using a paste and the like can be simplified. That is, a dense matrix need not be produced in this step as long as no large cracks or unhealable defects are formed on the resulting shaped material. Furthermore, the magnetic shielding power largely depends on the pinning force of the material constituting the shield. Accordingly, it is effective to previously add a material which serves as a pinning center in the course of forming the matrix.

The second step of the process according to the present invention comprises coating the matrix (magnetic shielding container) obtained in the first step and having pores by depositing a film using a CVD (chemical vapor deposition) process and the like, to thereby obtain a densified high quality shaped material by filling the pores with the oxide superconducting material by chemical vapor deposition. This step is characterized by that an oxidizing gas is introduced into one of inside and outside of the shaped material (e.g. a magnetic shielding container comprising an oxide superconducting material) while the raw material gas required for forming the oxide superconducting material is introduced into the other one of the inside and outside of the magnetic shielding container. For example, organometallic complexes of each of the constituent metals of the oxide superconductor are introduced as the raw material gas, and by controlling the flow rate and pressure of the oxidizing gas and the raw material gas, an oxide superconducting material is produced in such a manner that the pores on the matrix may be thereby sealed. That is, the coating grows preferentially on portions having a higher gas permeability to give as a whole, a densified shaped material. The principle of this process is explained briefly below referring to FIG. 1.

Figure 1B:
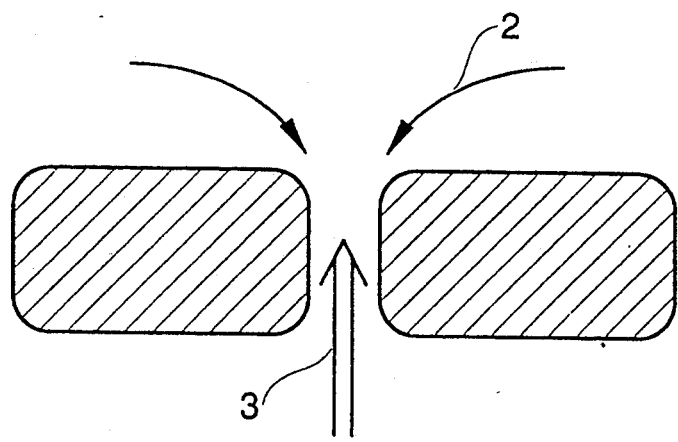
Figure 1C:
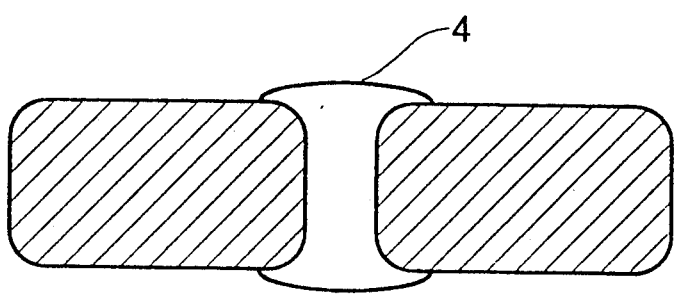

Referring to FIG. 1(A), a porous matrix comprising many pores 1 therein is obtained by sintering of a slurry and the like. Then, as shown in FIG. 1(B), an oxidizing gas 3 and a material gas 2 are each supplied to the porous matrix from one side and the other, respectively, so that the gases may be mixed and reacted to yield an oxide at the vicinity of the aforementioned pores. By then maintaining the porous matrix at a high temperature (e.g. 500° to 1000° C.), an oxide superconductor 4 is formed through the reaction of the two gases and is deposited at the vicinity of the pores. If the rate of gas permeation is sufficiently lowered at the pores, the superconducting material can be deposited on the pores as shown in FIG. 1(C), i.e., in such a manner that the superconducting material seals the pores.

The method of the present invention can also be applied to a substrate in general although the magnetic shielding container is an example thereof. A method for forming an oxide superconducting material in accordance with the present invention comprises:

introducing an oxidizing gas and a raw material gas into one surface of a substrate being permeable to a gas and an opposite surface of said substrate to said one surface, respectively at a high temperature; and forming a film comprising an oxide superconducting material on said substrate by reacting said raw material gas with said oxidizing gas by permeation of said raw material gas and said oxidizing gas through said substrate.

The substrate may comprise a material other than an oxide superconducting material. Also, the substrate may comprise a molding comprising an oxide superconducting material, and said one surface is one of inside and outside surfaces of said molding, and said opposite surface is the other one of the inside and outside surfaces of said molding. The molding coated with said film comprising the oxide superconducting material is used as a magnetic shielding container.

Furthermore, the aforementioned two types of gases may be switched during the process to form a dense coating on both sides of the shaped material. Any type of CVD processes may be used in the present invention as long as an oxidizing gas corresponding to the selected process is incorporated. More specifically, for example, an MOCVD (metal-organic CVD) using an organometallic complex as the starting material, and a halide CVD using halides of the metals constituting the superconducting material may be used. Furthermore, there is no particular restriction concerning the pressure under which the film is deposited. However, considering that a high quality film as that for use in devices and the like is not necessary, and that a higher film deposition rate is preferred, a normal pressure or a low vacuum process sufficiently provides the required film.

As described in the foregoing, the CVD process according to the present invention is characterized by that it proceeds in such a manner that the film is deposited to seal the defects of the shaped material. Accordingly, it has been believed that the process no longer proceeds after once the defects and the like are completely sealed.

However, contrary to expectation, the entire surface of the shaped material was covered, though at a reduced film deposition rate, with a hard and dense coating when the film deposition was continued even after a shaped product dense enough to prevent gas permeation, or a molding not being permeable to a gas, was obtained. This is ascribed to the exceptionally high oxygen ion transfer rate of the oxide superconductor itself. The phenomena is known in other fields and practically used as Electro-chemical Vapor Deposition. The principle of this phenomena is described briefly below referring to FIG. 2.

Figure 2A:
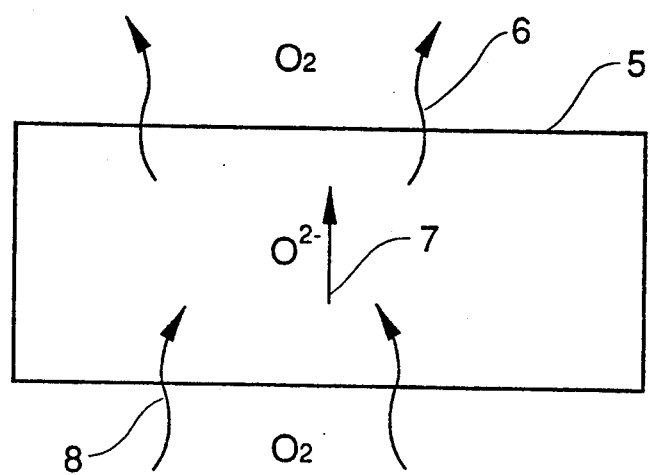
FIGS. 2(A) and 2(B) show schematically an Electrochemical Vapor Deposition process according to the present invention.
Figure 2B:
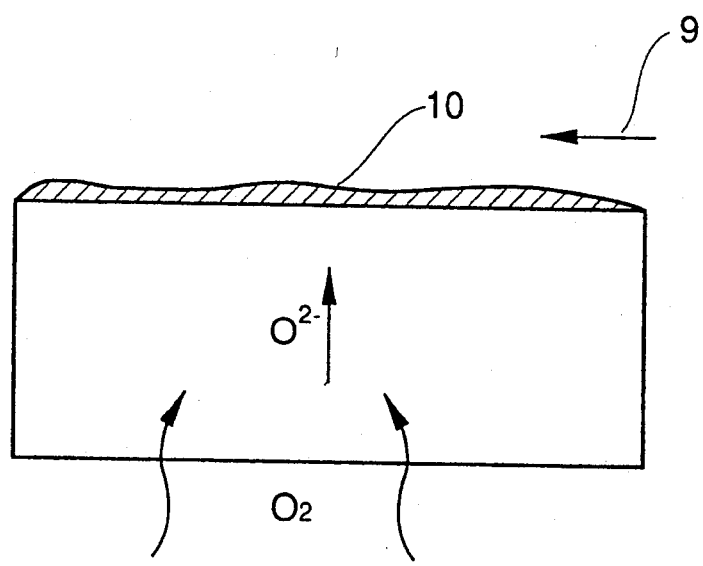

Referring to FIG. 2, an oxide superconductor 5 is sandwiched between portions having a high (the lower part in FIG. 2) and a low oxygen partial pressure (the upper part in FIG. 2). Thus, a so-called concentration cell is formed between the upper part and the lower part of the superconductor 5 to generate an electromotive force. Accordingly, oxygen 8 at the boundary between the oxygen rich side and the superconductor 5 is ionized and moves through the superconductor 5 as an oxygen ion 7 of the oxygen and oxygen 6 is generated from the oxygen ion again in the side having low oxygen concentration. In this manner, an ionic current is generated in the structure as illustrated in FIG. 2(A). As shown in FIG. 2(B), the oxygen thus generated reacts with the oxide superconductor gas (raw material gas) 9 at the vicinity of the surface of the matrix to form a dense and high quality thin film over the entire surface. Thus, a method for forming an oxide superconducting material in accordance with the present invention comprises:

introducing a raw material gas and an oxidizing gas comprising oxygen into one surface of a substrate and an opposite surface of said substrate to said one surface, respectively at a high temperature; and forming a film comprising an oxide superconducting material on said substrate by reacting said raw material gas with an oxidizing material by permeation of an oxygen ion of said oxygen through said substrate.

The substrate has an oxygen ion conductivity and may comprise a material other than an oxide superconducting material. The substrate may comprise a molding comprising an oxide superconducting material and being permeable to an oxygen ion, and said one surface may be one of inside and outside surfaces of said molding, and said opposite surface may be the other one of the inside and outside surfaces of said molding.

The coating step can be confirmed as being an Electro-Chemical Vapor Deposition process by detecting the ionic current. More specifically, porous platinum electrodes were formed on each of the outer and the inner surfaces of the gas-impermeable dense shaped material, and the current was detected to confirm the presence of an ionic current.

The same can be confirmed on an oxide superconductor being formed on a substrate having an oxygen ion conductivity. The thin film having deposited by the Electro-chemical Vapor Deposition process is far denser and of higher quality as compared with those obtained by conventional processes such as CVD. In this manner, the process of the present invention having added the Electro-chemical Vapor Deposition step provides a shaped material free of defects such as pinholes. Hence, the product obtained as a result serves as a favorable magnetic shield.

The process comprising the sequence of steps described above provides an effective superconducting material by controlling the atmosphere during film deposition and sintering. Furthermore, an optional annealing in an arbitrary atmosphere is also effective.

The process according to the present invention provides a dense shaped superconducting material at high productivity. The process requires no complicated apparatus nor additional process steps. The process is of general use because it can be realized by a combination of the known processes.

Further, a method for forming an oxide superconducting material in accordance with the present invention comprises:

preparing a paste for forming an oxide superconducting material;

forming a body having a predetermined shape from said paste;

firing said body in order to make said body superconductive; and depositing a further oxide superconducting material on said body by vapor phase deposition or Electrochemical Vapor Deposition after said firing step.

The deposition of the further oxide superconducting material may comprise the step of making an oxidizing gas and a raw material gas flow on or through said body while said body is heated.

The present invention is illustrated in greater detail referring to non-limiting examples below. It should be understood, however, that the present invention is not to be construed as being limited thereto.

EXAMPLE 1

A process for producing a cylindrical magnetic shield from an yttrium based (representatively, $YBa_2Cu_3O_7$) oxide superconductor according to an embodiment of the present invention is described below.

The starting powder materials were mixed by a wet process to obtain a mixture containing yttrium (Y), barium (Ba), and copper (Cu) at a ratio by molar of Y:Ba:Cu=1:2:3. In practice, yttrium was added in excess to obtain the so-called 221 phase to achieve a higher critical current density Jc. Furthermore, a trace amount of platinum was also added to the starting material. The resulting mixture was calcined, crushed, sintered, and annealed to confirm formation of a superconducting material. The oxide superconductor thus obtained was size-reduced to obtain a fine powder, and was mixed with an organic binder to obtain a slurry. Care must be taken so as not to add the organic binder in excess, because too large an amount of binder may form large voids in the shaped material.

The slurry thus prepared was then extended on a Teflon sheet at a thickness of about 5 mm, and the entire sheet was coiled to obtain a cylindrical shaped material. The end of the cylindrical material was sealed with the same sheet using a paste.

The shaped material was dried, sintered in oxygen at 960° C. for 6 hours, and gradually cooled at a cooling rate of 100° C./hour. In this manner, the shaped material was allowed to sufficiently absorb oxygen during the process. The sintering step must be carried out carefully so that the intended shape may be retained throughout; i.e., so that no local stress may be applied to the shaped material. Thus was obtained a sintered container about 100 mm in diameter and about 500 mm in length. The density of the shaped material was measured by Archimedes process, and was found to be about 70% of the theoretical value. The shaped body thus obtained was somewhat porous, and a considerable amount of voids were found to be present by testing the gas permeation.

Figure 3:
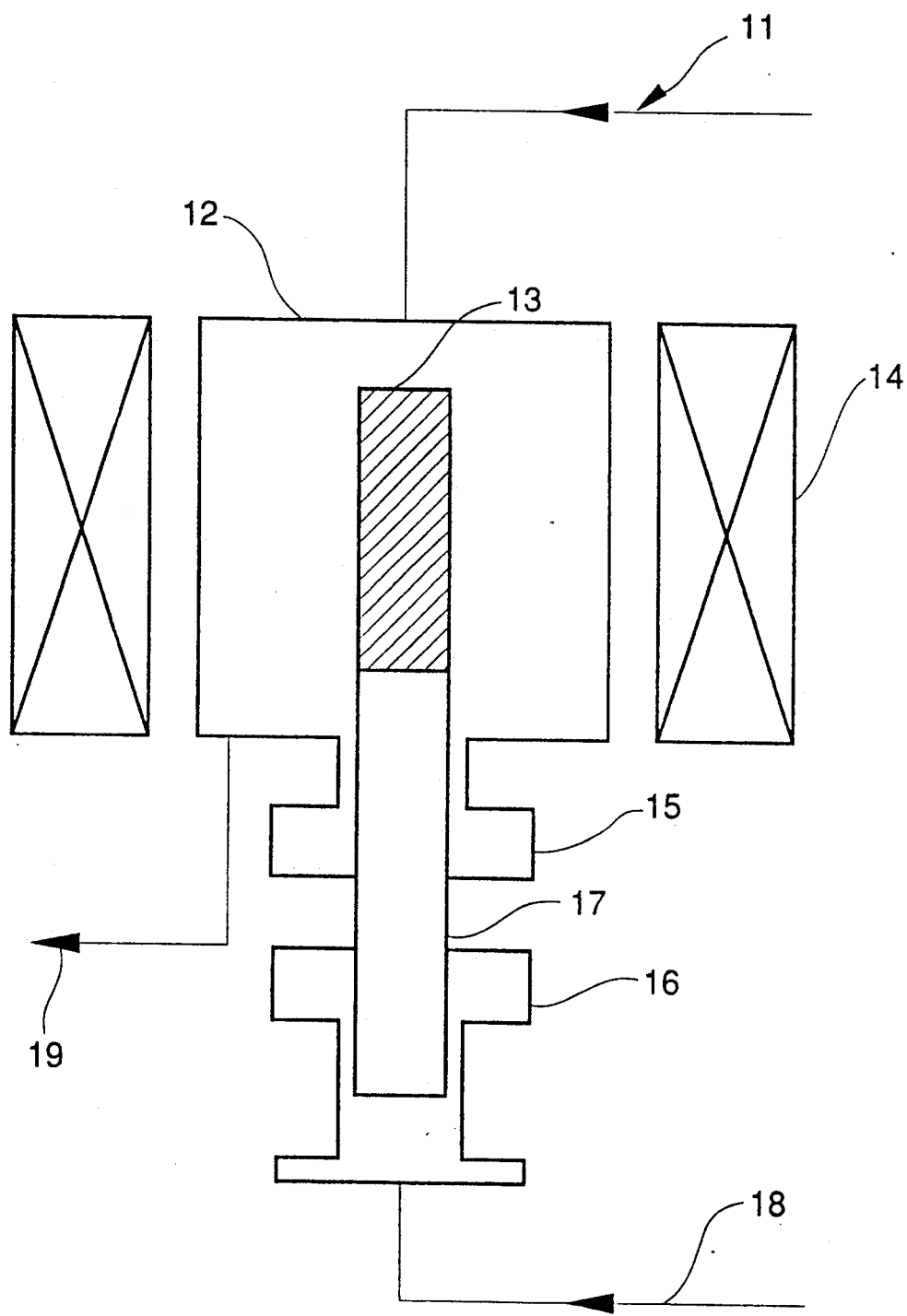
FIG. 3 shows schematically a hot-wall type CVD apparatus according to the present invention.

The sintered container was then fixed to the top end of a 100-mm diameter alumina tube 17 using an alumina-based inorganic adhesive. The alumina tube was further fixed to gauge ports 15 and 16 to obtain a structure as shown in FIG. 3.

Film deposition was effected on the sintered container 13 of oxide superconductor having fixed on an alumina tube by supplying an oxygen flow from the inside and a flow of gases of $\beta$-diketone (DPM) complexes of the constituent metals from the outside of the container. The film deposition reaction was effected under a pressure of 100 Torr. Each of the material gases was subjected to compositional control by adjusting the temperature of the cell individually, and was each transported to the reaction vessel using argon gas as the carrier. Meanwhile, the oxide superconductor container 13 was maintained at 750° C. using a hot-wall type reaction vessel 12 equipped with a heater 14.

The sintering process was observed with a zirconia type oxygen sensor having installed in front of a rotary pump being placed at the evacuation side 19.

Film deposition was initiated by supplying the material gas 11 at a flow rate of 200 sccm and oxygen 18 at a flow rate of 10 sccm, while controlling the supply pressure to 100 Torr. The pressure inside the reaction vessel was maintained constant by controlling the conductance at the evacuation side using an APC (automatic pressure control).

About three hours after the initiation of film deposition, the oxygen sensor detected gradual drop in oxygen concentration. This assumably is an evidence showing sealing of the voids and other defects in the superconductor container. With progress of film deposition under reduced gas flow rate for 5 more hours, a clear drop in oxygen pressure was observed. It can be seen that substantially no oxygen was supplied through the voids and the like thereafter. In other words, the process proceeded from the step of CVD to that of Electrochemical Vapor Deposition. Accordingly, the material gas flow was further reduced to 50 sccm to continue film deposition for 5 more hours.

On completion of film deposition, material gas was cut off, and oxygen gas was supplied in the place thereof. The sintering thus obtained was cooled in the furnace while maintaining the inside and the outside oxygen pressure to 1 atm. The resulting sintering was taken out from the furnace after it was cooled sufficiently to room temperature.

The oxide superconductor cylinder thus obtained had a smooth surface, and the morphology of the grains was observed to greatly differ from that having observed on the initial matrix which was formed directly from the slurry.

Finally, the sintering was cut from the alumina tube at the joint, and the sealed end thereof was also cut to obtain a cylindrical magnetic shield having open ends. The superconductivity of the resulting cylinder was confirmed by a DC four-terminal method on the cut ends. Zero resistance was observed at 91K.

Thus was obtained a cylindrical magnetic shield having a diameter of about 50 mm and a wall thickness of about 4.5 mm. This magnetic shield yielded a magnetic shield capacity of about 14 Gauss when a magnetic field was applied along the axial direction of the cylinder. This value was far higher as compared with that (5 Gauss) of a mere sintering obtained from the same slurry as that used above. This comparative sintering corresponds to the matrix of the shaped material according to the present invention. Thus was confirmed that the process according to the present invention is effective in producing magnetic shields from oxide superconductors.

EXAMPLE 2

A process for producing a cylindrical magnetic shield from an yttrium based oxide superconductor similar to that of Example 1 is described below, except that a thin film of an oxide superconductor is deposited not only on the outside but also on the inside.

A thin film of oxide superconductor was deposited on the inner surface of the cylinder during the CVD process, i.e., before the voids and the like are completely sealed. This was done by switching the gas supplied to the outside with that supplied to the inside of the cylinder every 30 minutes. The process takes a longer time, i.e., about 1.4 times as long as that required for a process for depositing the film only on one side. The apparatus used in the present process was the same as that used in Example 1, and the transition from a CVD process to an Electro-chemical Vapor Deposition process was again judged by observing the amount of permeated oxygen.

The Electro-chemical Vapor Deposition process consumed 5 hours for completion per side; hence, it took 110 hours to complete film deposition on both sides. As a result, a magnetic shield having improved in magnetic shielding capacity to about 17 Gauss was obtained.

EXAMPLE 3

An oxide superconductor magnetic shield was produced by coating an oxygen ion conductive base, i.e., a YSZ (yttria stabilized zirconia) sintering, with a paste comprising an oxide superconductor. The oxide superconductor used herein was the same yttrium based (representatively, $YBa_2Cu_3O_7$) oxide superconductor as that employed in Example 1. Accordingly, a paste was prepared in the same manner as that described in Example 1.

Intentionally, a porous YSZ sintering was used herein. The YSZ sintering was a tube having a sealed end, and was 50 mm in diameter and about 1,000 mm in length. This YSZ sintering having an appearance like a protective tube was coated with the paste over a length of 500 mm from the top end. The coating was applied repeatedly, followed by drying and sintering each time, to obtain a final dry coating thickness of about 2 mm.

Essentially the same process as that described in Example 1 was conducted thereafter on the shaped product having a thick oxide superconductor film applied thereon, except for some details such as the duration of film deposition.

This magnetic shield yielded a magnetic shield capacity of about 8 Gauss when a magnetic field was applied along the axial direction of the cylinder. This value was lower than those obtained in Examples 1 and 2 above. This inferiority is believed ascribable to the reduced thickness of the oxide superconductor portion.

EXAMPLE 4

A process for producing a cylindrical magnetic shield similar to that of Example 1 is described below, except that a bismuth based oxide superconductor (representatively, the so-called 2212 phase, which is known also as a 80-K phase) is used.

The starting powder materials were mixed by a wet process to obtain a mixture containing bismuth (Bi), strontium (Sr), calcium (Ca), and copper (Cu) at a ratio by molar of Bi:Sr:Ca:Cu=2:2:1:2. The resulting mixture was calcined, crushed, sintered, and annealed to confirm formation of a superconducting material. In this case, fine powder of silver was added to the composition with an aim to increase the critical current density of the resulting sintering. The oxide superconductor thus obtained was size-reduced to obtain a fine powder, and was mixed with an organic binder to obtain a slurry. Care must be taken so as not to add the organic binder in excess, because too large an amount of binder may form large voids in the shaped material.

Then, a magnetic shield of the same size as that produced in Example was obtained in the same manner as described in Example 1.

The resulting shaped superconducting material was coated with a thin film by normal pressure CVD, so as to speed up the coating process. The material gas used herein were DPM complexes of each of the constituent metals, which were each heated to a temperature range of from 120° to 270° C. Argon gas was used as the carrier gas to transport each of the material gases to the reaction chamber. The film deposition was effected under a pressure of about 1 atm. and at a temperature of 750° C., using the same apparatuses in the same arrangement as those in the process described in Example 1. Oxygen was also supplied at a pressure of about 1 atm. The flow rate at the initiation of film deposition were set at 500 sccm and 100 sccm for the material gas and oxygen, respectively, to speed up the film deposition.

The film deposition process proceeded essentially in the same manner as in the process of Example 1, except that the transition from CVD to Electro-chemical Vapor Deposition was observed after 3 hours from the initiation of the film deposition. About 3 more hours was necessary thereafter to complete the film deposition. Then, the resulting shaped superconducting material was annealed in a slightly reducing atmosphere comprising a gas mixture of argon and oxygen. Subsequently, the shaped superconducting material was cooled slowly in the furnace with care so that no cracks may generate thereon.

Finally, the sintering was cut from the alumina tube at the joint, and the sealed end thereof was also cut to obtain a cylindrical magnetic shield having open ends similar to that of Example 1. The superconductivity of the resulting cylinder was confirmed by a DC four-terminal method on the cut ends. Phase identification by XRD (X-ray diffraction) revealed presence of 100-K phase, but it was confirmed that the superconducting material thus obtained was composed mostly of 80-K phase.

Thus was obtained a cylindrical magnetic shield at the same dimension as that produced in Example 1. The magnetic shield of the present Example yielded a magnetic shield capacity of about 35 Gauss when a magnetic field was applied along the axial direction of the cylinder. This value was far higher as compared with that of the shield obtained in Example 1. This superiority is believed ascribable to the difference in critical current density and the like, because the shaped materials obtained in Example 1 and in the present Example are of the same dimension.

As described in detail in the foregoing, it can be seen that the process according to the present invention provides high quality oxide superconducting materials at a desired shape and at an improved productivity. The process can be carried out using known technology at a relatively low cost.

In the present Examples, reference were made particularly to cylindrical magnetic shields. However, the present invention is not only restricted thereto, but may be readily applied to the production of magnetic shields shaped differently, for example, those shaped into sheets. Furthermore, oxide superconducting materials having improved in quality can be realized by using powerful oxidizing gases other than oxygen, and, of course, water vapor oxidation can be applied depending on the starting materials used in the process.

In short, the process is promising in producing various types of magnetic shields and hence is greatly contributory to the industry.

While the invention has been described in detail and with reference to specific examples thereof, it will be apparent to one skilled in the art that various changes and modifications can be made therein without departing from the spirit and scope thereof.

What is claimed is:

1. A method for forming an oxide superconducting body comprising:
   providing a magnetic shielding container made of an oxide superconducting material having means for introducing a gas to the inside of said container and means for introducing a gas to the outside of said container and having at least one pore communicating between said inside and said outside of said container;
   introducing an oxidizing gas and a raw material gas required for forming an oxide superconducting material into one of inside and outside of said magnetic shielding container and the other one of the inside and outside of the magnetic shielding container, respectively at a temperature sufficiently high to form said oxide superconducting material; and
   allowing said oxidizing gas and said raw material gas to permeate said magnetic shielding container; wherein said raw material gas and said oxidizing gas mix to form said oxide superconducting material to seal said pore of said magnetic shielding container.

2. The method of claim 1 wherein said temperature is 500° to 1000° C.

3. The method of claim 1 wherein said oxide superconducting material is formed by said introducing step by chemical vapor deposition.

4. A method for forming an oxide superconducting material comprising:
   introducing a raw material gas and an oxidizing gas comprising oxygen into one surface of a substrate having an ion conductivity and an opposite surface of said substrate to said one surface, respectively at a temperature sufficiently high to form said oxide superconducting material; and
   forming a film comprising an oxide superconducting material on said one surface of said substrate disposed to said raw material gas by reacting said raw material gas with an oxidizing material by permeation of at least an oxygen ion formed when said oxygen is ionized through said substrate.

5. The method of claim 4 wherein said substrate comprises a material other than an oxide superconducting material.

6. The method of claim 4 wherein said oxidizing material is an oxygen formed from said oxygen ion of said oxygen.

7. The method of claim 4 wherein said substrate comprises a molding comprising an oxide superconducting material and being permeable to an oxygen ion, and said one surface is one of inside and outside surfaces of said molding, and said opposite surface is the other one of the inside and outside surfaces of said molding.

8. The method of claim 4 wherein said temperature is 500° to 1000° C.

9. The method of claim 7 wherein said molding is not permeable to a gas.

10. A method of forming an oxide superconducting magnetic shield container comprising:
    preparing a paste for forming an oxide superconducting material;
    forming a self-supporting shaped body from said paste;
    firing said body to form said oxide superconducting magnetic shield container, and
    depositing a further oxide superconducting material on a surface of said container by vapor phase deposition or electro-chemical vapor deposition after said firing step.

11. The method of claim 10 wherein said depositing step comprises the step of making an oxidizing gas and a raw material gas flow on or through said body while said body is heated.

12. The method of claim 7 wherein said molding is permeable to a gas.

13. A method for forming an oxide superconducting body comprising the steps of:
    preparing a matrix for forming said body, said matrix having pores;
    introducing an oxidizing gas to a first surface of said body;
    introducing a raw material gas to a second surface opposite to said first surface wherein said pores allow said oxidizing gas and said raw material gas to permeate therethrough so that said gases mix with each other;
    forming an oxide superconducting material on inner surfaces of said pores through chemical vapor deposition from said oxidizing gas and said raw material gas in order to stop said pores with said oxide superconducting material;
    continuing the introduction of said oxidizing gas and said raw material gas after stopping said pores; and
    forming a further oxide superconducting material on said second surface by electro-chemical vapor deposition.

14. The method of claim 13 wherein a temperature of said matrix is maintained sufficiently high to cause said chemical vapor deposition and said electro-chemical vapor deposition to occur.

15. The method of claim 13 wherein said matrix itself comprises said oxide superconducting material.

16. The method of claim 13 wherein said body is a magnetic shield container.

17. The method of claim 13 wherein oxygen ions permeate through said matrix and react with said raw material gas to form said further oxide superconducting material on said second surface.

* * * * *